United States Patent [19]

Omoto et al.

[11] Patent Number: 4,990,982
[45] Date of Patent: Feb. 5, 1991

[54] SEMICONDUCTOR DEVICE OF HIGH BREAKDOWN VOLTAGE

[75] Inventors: Kayoko Omoto; Kazuaki Miyata, both of Hyogo, Japan

[73] Assignee: Mitsubishi Denki Kabushiki Kaisha, Tokyo, Japan

[21] Appl. No.: 428,017

[22] Filed: Oct. 26, 1989

Related U.S. Application Data

[63] Continuation of Ser. No. 156,435, Feb. 16, 1988, abandoned.

[30] Foreign Application Priority Data

Aug. 25, 1987 [JP] Japan ................... 62-210577

[51] Int. Cl.$^5$ .................. H01L 29/68; H01L 29/78
[52] U.S. Cl. ................. 357/23.800; 357/23.110; 357/23.400
[58] Field of Search ............... 357/23.8, 23.11, 23.4

[56] References Cited

U.S. PATENT DOCUMENTS

| | | | |
|---|---|---|---|
| 3,783,047 | 1/1974 | Paffen et al. | 357/23.11 |
| 3,899,372 | 8/1975 | Esch et al. | 357/23.11 |
| 4,023,195 | 5/1977 | Richman | 357/23.11 |
| 4,285,116 | 8/1981 | Meguro | 357/23.11 |
| 4,506,279 | 3/1985 | Mizutani | 357/23.11 |
| 4,613,883 | 9/1986 | Tihanyi | 357/23.11 |
| 4,613,886 | 9/1986 | Chwang | 357/23.11 |
| 4,769,686 | 9/1988 | Horiuchi et al. | 357/23.8 |
| 4,794,436 | 12/1988 | Blanchard | 357/23.8 |

FOREIGN PATENT DOCUMENTS 228766 12/1984 Japan .

OTHER PUBLICATIONS

IEEE transactions on Electron Devices, "A Novel CMOS-Compatible High Voltage Transistor Structure", by S. Parpia et al., vol. ED-33, No. 12, Dec. 1986, pp. 1948-1952.

Primary Examiner—William Mintel
Assistant Examiner—Roy K. Potter
Attorney, Agent, or Firm—Lowe, Price, LeBlanc, Becker & Shur

[57] ABSTRACT

The semiconductor device is of high break down voltage type and has a source, drain and a gate deposited therebetween on the semiconductor substrate. The gate oxide film has a thick portion and below that portion, a doped layer as a drain is provided with two layers having different impurity concentration.

8 Claims, 4 Drawing Sheets

SEMICONDUCTOR DEVICE OF HIGH BREAKDOWN VOLTAGE

This application is a continuation of application Ser. No. 07/156,435, filed Feb. 16, 1988, now abandoned.

BACKGROUND OF THE INVENTION

1. Field of the Invention

The present invention relates to a semiconductor device and the method for making the same and, more specifically, it relates to a semiconductor device with improved high break down voltage characteristics and the method for making the same.

2. Description of the Prior Art

FIG. 1 shows one example of a prior high voltage semiconductor device. The semiconductor device having such structure is disclosed in, for example, Japanese Patent Laying-Open Gazette No. 228766/1984.

Referring to FIG. 1, a N type source region 22 is formed on a first area on a main surface of a P type silicon substrate 21. A N+ type drain region 23 is formed on a second area on the main surface of the P type silicon substrate 21. An oxide film 24 is formed between the first area and second area on the main surface of the substrate 21. An oxide film 25 thicker than the gate oxide film 24 is formed between the gate oxide film 24 and the second area of the substrate 21. In addition, a gate electrode 26 is formed extending over the gate oxide film 24 and a portion of the oxide film 25. A N− type drain region 27 having impurity concentration lower than the N+ type drain region 23 is formed below the oxide film 25. Consequently, the N type source region 22, N− type drain region 27, N+ type drain region 23 and the gate electrode 26 form a field effect device including a N channel field effect transistor.

In operation, a positive constant bias (usually 5 V) is applied to the gate electrode 26 to turn the transistor on. The P type silicon substrate 21 and the N type source region 22 are connected to the ground. A positive bias is applied to the N+ type drain region 23. On this occasion, electrons pass from the N type source region 22 through a channel formed directly below the gate oxide film 24 and through the N− type drain region 27 to the N+ type drain region, flowing a current. Consequently, the field effect transistor is turned on.

In the above described prior high voltage semiconductor device, the impurity concentration in the N− drain region is low causing high resistance, so that it had a problem that gm (transconductance) is lowered.

SUMMARY OF THE INVENTION

The present invention was made to solve the above described problem and its object is to provide a semiconductor device which is capable of raising gm as well as maintaining a high break down voltage.

The semiconductor device according to the present invention comprises a field effect device including a semiconductor substrate of one conductivity type having a main surface, a pair of a first source.drain regions of the opposite conductivity type formed spaced apart with each other, a gate oxide film between a pair of the first source.drain regions on the main surface of the semiconductor substrate, an oxide film thicker than the gate oxide film extending from the gate oxide film to at least one side of a pair of the first source.drain regions, a second source.drain region continuing and extending from at least one of the first source.drain regions on that side where the oxide film thicker than the gate oxide film is deposited to the lower side of the oxide film thicker than the gate oxide film and having a two-layered structure comprising a first doped layer of the opposite conductivity type of low impurity concentration and a second doped layer of the opposite conductivity type with a high impurity concentration covered the first doped layer and, a gate electrode formed between the other one of the first source.drain regions and the second source.drain region, extending from the gate oxide film to a portion of the oxide film thicker than the gate oxide film.

A method for manufacturing the semiconductor device according to the present invention comprises the steps of forming a second doped layer having high impurity concentration on a prescribed portion on the substrate, forming a first doped layer having an impurity concentration lower than that of the impurity concentration of the second doped layer, forming an oxide film thicker than the gate oxide film above the second doped layer, forming a thin gate oxide film connected with said oxide film thicker than the gate oxide film on the substrate as well as forming a gate electrode thereon, and forming a pair of first source.drain regions on the substrate so that the pair sandwiches said second drain region and said first gate oxide film.

Meanwhile, said oxide film thicker than the gate oxide film and the second source.drain region may be provided on one side of said pair of the first source.drain regions or may be provided on both sides thereof. As for the second source.drain region, the first doped layer may be connected to the first source.drain regions and the second doped layer may be arranged between the first doped layer and the oxide film thicker than the gate oxide film. Preferably, the impurity concentration is set such that it becomes gradually lower in order of the first source.drain regions, the second doped layer and the first doped layer.

A constant bias is applied to the gate electrode in order to turn the field effect device on. The first source.drain region serving as a source and the substrate are connected to the ground.

As the bias applied to the first source.drain region serving as a drain is increased, electrons pass from the first source.drain region serving as a source through a channel formed directly below the gate oxide film, the first doped layer and through the second doped layer to the first source drain region serving as a drain and so a current flows. Consequently, the field effect device turns on.

On this occasion, the resistance against the electrons passing is low since the second doped layer has a high impurity concentration.

Therefore, the present invention raises gm and maintains the high break down voltage characteristics.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
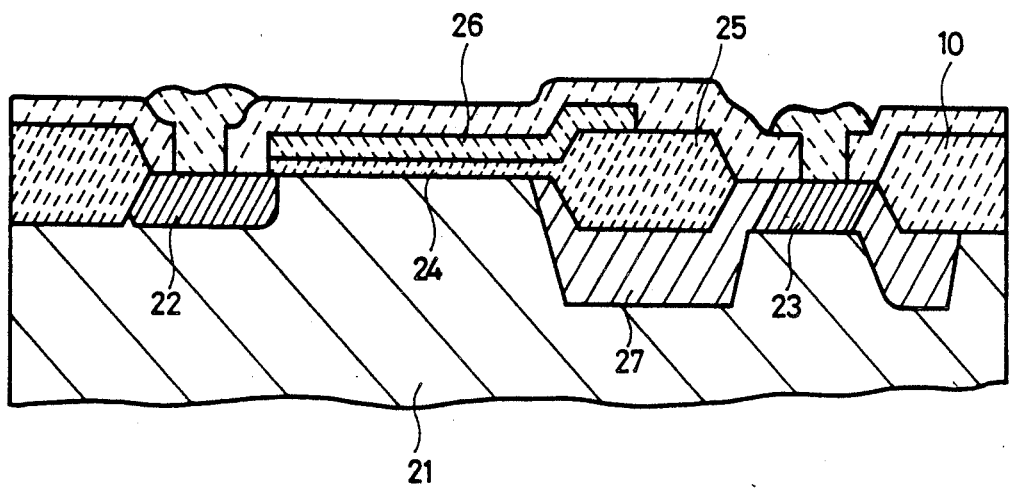
FIG. 1 is a vertical cross sectional view of a prior high voltage semiconductor device.
Figure 2:
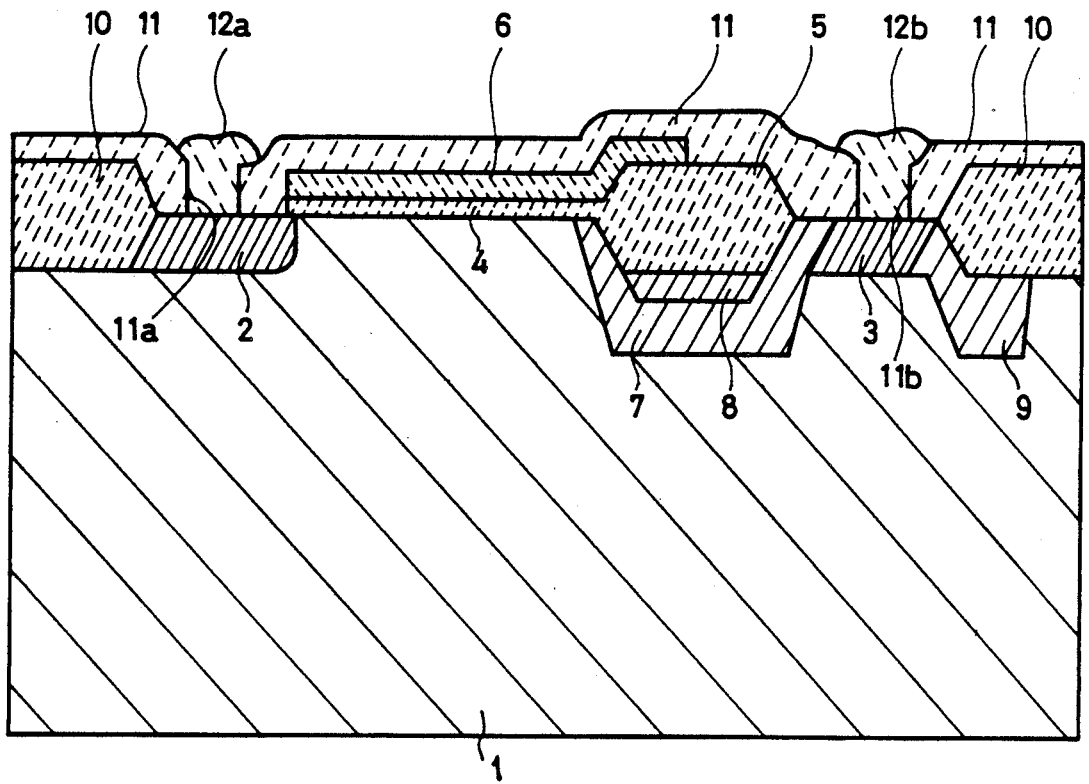
FIG. 2 is a vertical cross sectional view showing a semiconductor device according to one embodiment of the present invention.

FIG. 2 is a cross sectional view of a field effect transistor according to one embodiment of the present invention. Referring to FIG. 2, a N type source region 2 is formed on a first area of a main surface of a P type silicon substrate 1. Spaced apart from the N type source region 2, a N+ drain region 3 is formed on a second area of the main surface of the P type silicon substrate 1. A gate oxide film 4 is formed between the first area and the second area of the P type silicon substrate. A gate oxide film 5 thicker than the gate oxide film 4 is formed between the second area of the P type silicon substrate 1 and the gate oxide film 4. A gate electrode 6 is formed extending over the gate oxide films 4 and a portion of the oxide film 5.

Below the oxide film 5, an N drain region 8 having the concentration lower than that of the N+ drain region 3 is formed. An N− drain region 7 having the concentration lower than that of the N drain region 8 is formed such that it covers the lower portion of the N drain region 8. The thick oxide film 5 extends lower to almost the same level as with the lower edge of the N+ drain region 3 and the N drain region 8 extends along the lower edge thereof. The N− drain region 7 extends lower from the N+ drain region 3 along the oxide film 5 and further extends along the lower end surface of the N drain region 8 toward the lower end surface of the gate oxide film 4 along the side surface of the oxide film 5. As a result, the structure is realized in which the N drain region 8 exists below the oxide film 5 and is covered from the lower side thereof with the N− drain region 7. The relation between the impurity concentrations of the respective regions in the drain portion is selected such that as the concentration in the N+ drain region 3 is about $10^{20}$; that in the N drain region 8 is about $10^{18}$; and that in the N− drain region 7 is about $10^{17}$. The impurity concentration of the P type silicon substrate 1 is about $10^{14}$.

In addition, an element separation oxide film 10 is formed on the P type silicon substrate 1 adjacent to the N type source region 2 and the N+ drain region 3. The N− region 9 extending from the N+ drain region 3 extends below the adjacent element separating oxide film 10. A passivation film 11 is formed to cover the oxide films and electrode formed on the P type silicon substrate 1. Apertures 11a and 11b are formed at the portions corresponding to the source region 2 and the N+ drain region 3 of the passivation film 11. Through these apertures 11a and 11b, the source electrode 12a is in contact with the N type source region 2 and the drain electrode 12b is in contact with the N+ drain region 3.

From the foregoing, it is understood that the source region 2, N+ drain region 3, N− drain region 7, N drain region 8 and the gate electrode 6 form a N channel field effect transistor.

The above described semiconductor device is incorporated in, for example, an integrated circuit as one element for driving a liquid crystal display, fluorescent character display and the like.

Figure 3:
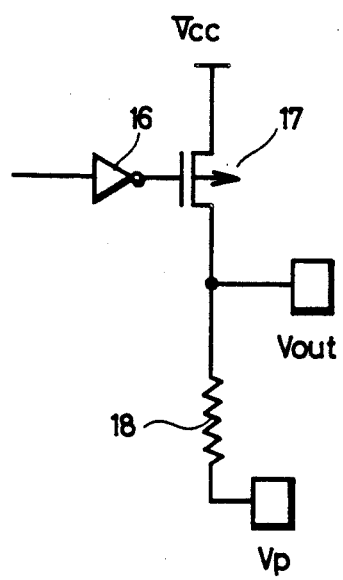
FIG. 3 shows a circuit incorporating the semiconductor device.

An output having the potential difference of 40 V is necessary for driving a fluorescent character display tube, for example. Therefore, the break down voltage of more than 40 V is required for the employed semiconductor device. One example of such circuit case is shown in FIG. 3. Referring to FIG. 3, the semiconductor device according to the present invention is used as a P channel field effect transistor 17. $V_{cc}$ of 5 V is connected to the source side of the transistor 17. $V_p$ of −35 V is connected to the drain side of the transistor 17 through $V_{out}$ and a resistance 18. An inverter 16, which carries out a first operation of sending a signal of 0 V and a second operation of sending a signal of 5 V, is connected to the gate electrode of the transistor 17.

Next, the method for manufacturing the semiconductor device according to the present invention will be described.

Figure 4A:
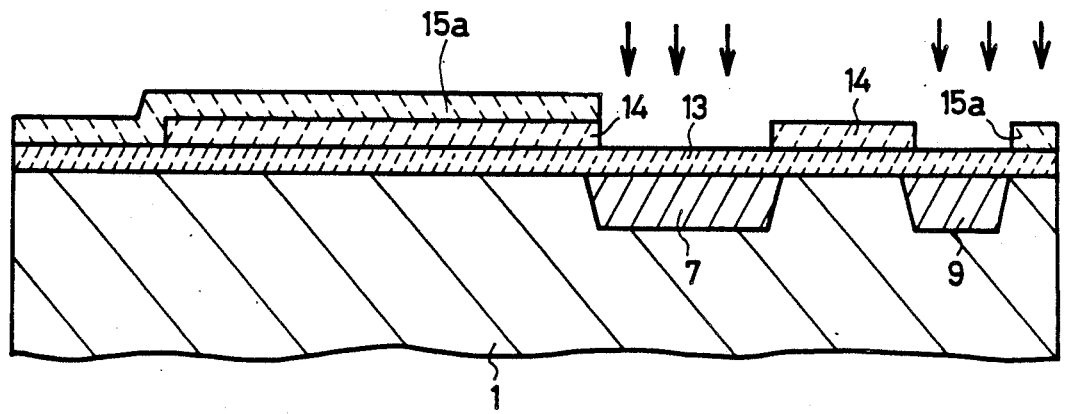
FIGS. 4A to 4E are vertical cross sectional views showing the manufacturing process of the semiconductor device.
Figure 4B:
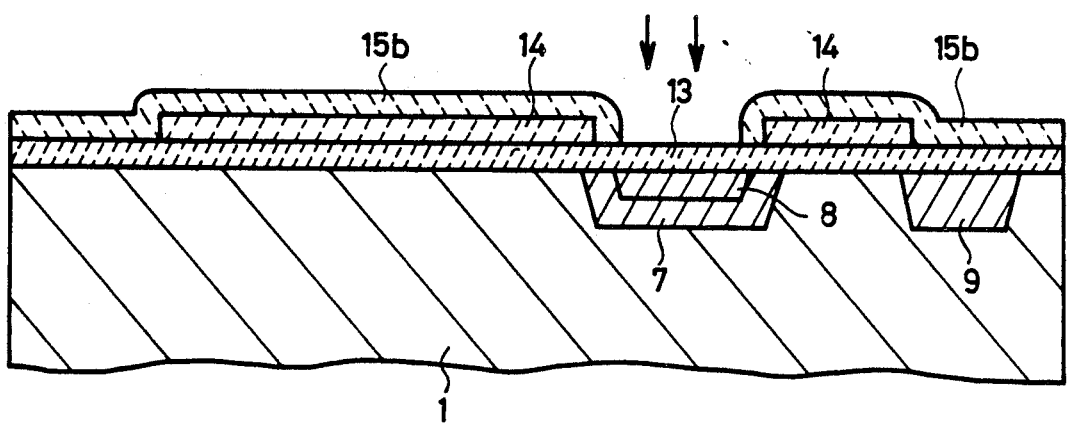

First, as shown in FIG. 4A, an underlying oxide film 13 is formed on the P type silicon substrate 1 and a nitride film pattern 14 is formed. Then, phosphorous implantation is carried out using the resist pattern 15a and a nitride film pattern 14 as implantation masks to form the N− drain region 7 and the N− region 9. Then the resist pattern 15a is removed and, as shown in FIG. 4B, a resist pattern 15b is formed. Arsenic implantation is carried out using the resist pattern 15b as a implantation mask to form the N drain region 8.

Figure 4C:
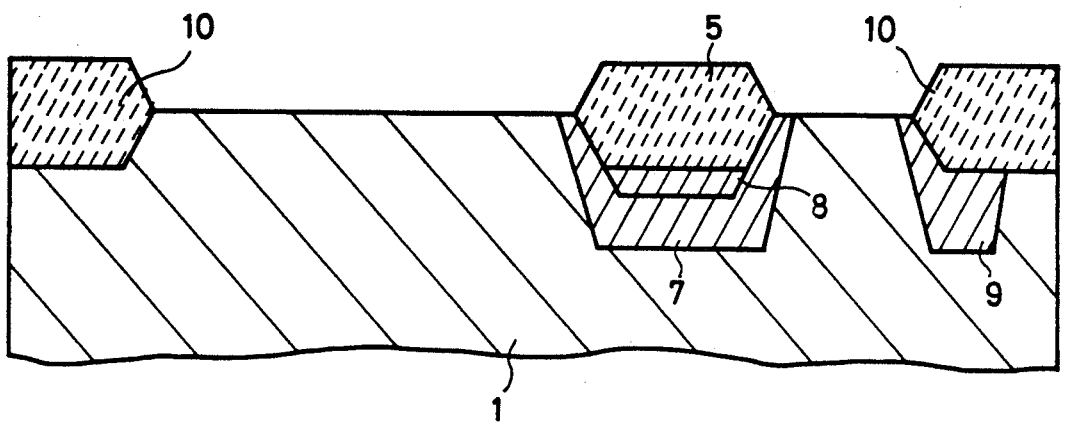
Figure 4D:
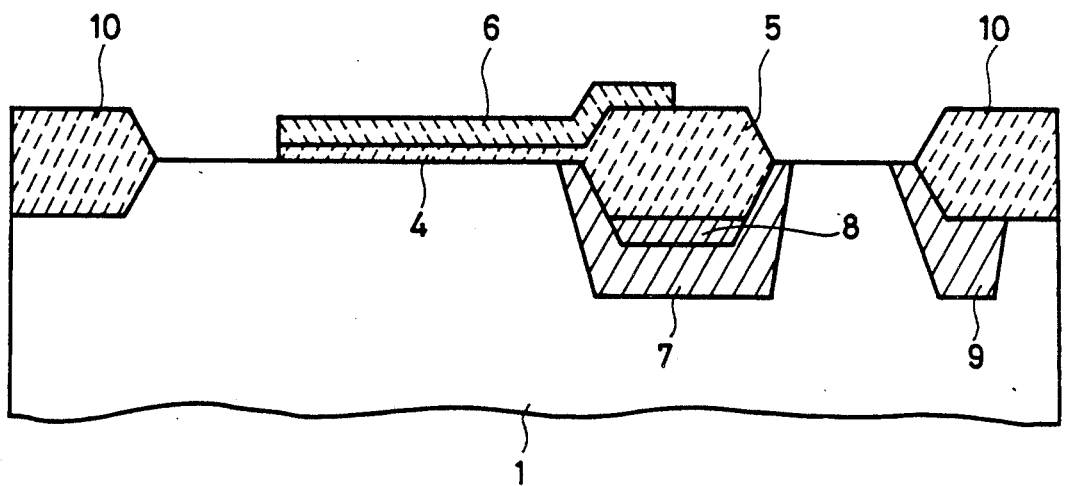
Figure 4E:
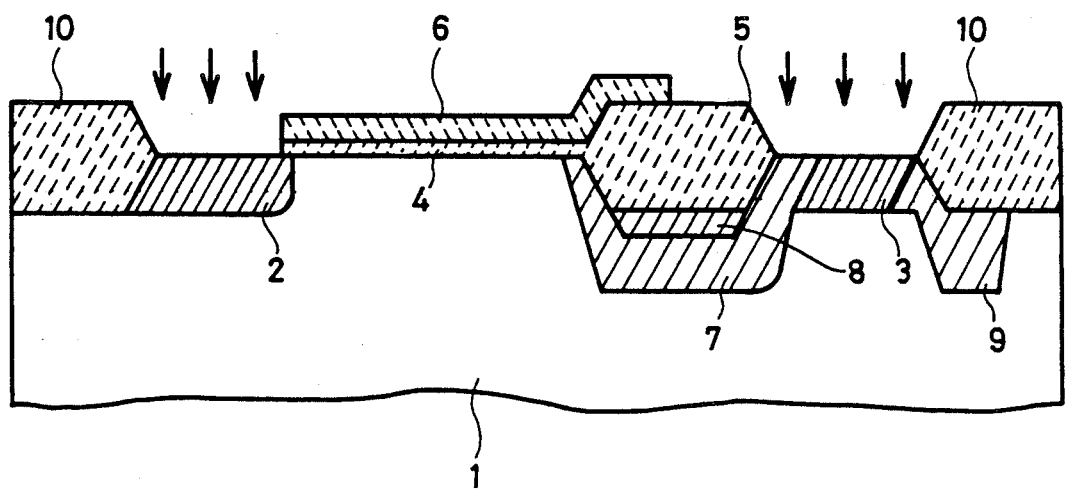

Then the resist pattern 15b is removed and selective oxidation is carried out by the nitride film 14 to form the thick oxide film 5 and an oxide film for separating elements 10 (FIG. 4C). On this occasion, the N− drain region 7, N drain region 8 and the N− region 9 are deeply diffused. Furthermore, the underlying oxide film 13 and the nitride film pattern are removed to obtain the structure shown in FIG. 4C. Then the gate oxide film 4 and the gate electrode 6 are formed as shown in FIG. 4D. Thereafter arsenic is ion implanted using the gate electrode 6, element separating oxide film 10 and the thick oxide film 5 as masks to form the N type source region 2 and the N+ drain region 3 as shown in FIG. 4E.

Finally, a passivation film 11 is formed and a source electrode 12a and a drain electrode 12b are formed in the apertures 11a and 11b formed on the passivation film 11 to obtain the structure of FIG. 2.

The operation of this embodiment will be described. A positive constant bias (usually 5 V) is supplied to the gate electrode 6 to turn the transistor on. The P type silicon substrate 1 and the N type source region 2 are connected to the ground.

As the positive bias is applied to the N+ drain region 3, electrons passes from the N type source region 2 through a channel formed directly below the gate oxide film 4, through the N− drain region 7 and N drain region 8 to the N+ drain region 3, whereby a current flows.

On this occasion, since the impurity concentration is large in the N drain region 8, the resistance against the electrons passing is low.

Therefore, a raised gm with high break down voltage characteristic is assured.

Figure 5:
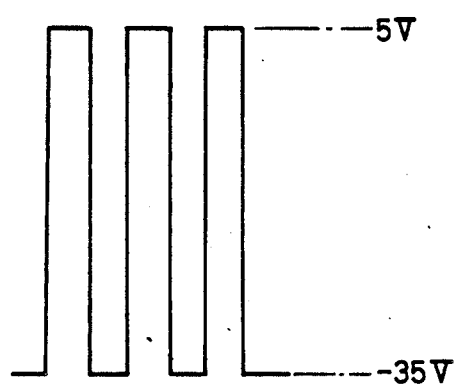
FIG. 5 is a waveform diagram showing the operation characteristics of the circuit shown in FIG. 2.

In the circuit shown in FIG. 3 using such semiconductor device, when the inverter 16 carries out a first operation of sending a 0 V signal, the transistor 17 turns on and 5 V is outputted from $V_{out}$. When the inverter 16 carries out the second operation of sending 5 V signal, the transistor 17 turns off and −35 V is outputted from V_out. The outputting state is shown in FIG. 5.

In the circuit shown in FIG. 3, when the second operation is carried out, a voltage of −40 V is applied between the gate and the drain of the transistor 17. However, when the semiconductor device according to the present invention is employed as the transistor 17, the transistor 17 can withstand this voltage since it has a high break down voltage characteristic. In addition, when the semiconductor device of the present invention is employed, gm can be raised since the second drain side becomes a path having low resistance.

Although a N channel is used in the above described embodiment, the structure according to the present invention may be employed in the P channel high voltage MOS transistor structure and the same function and the same effect will be obtained in this case.

Figure 6:
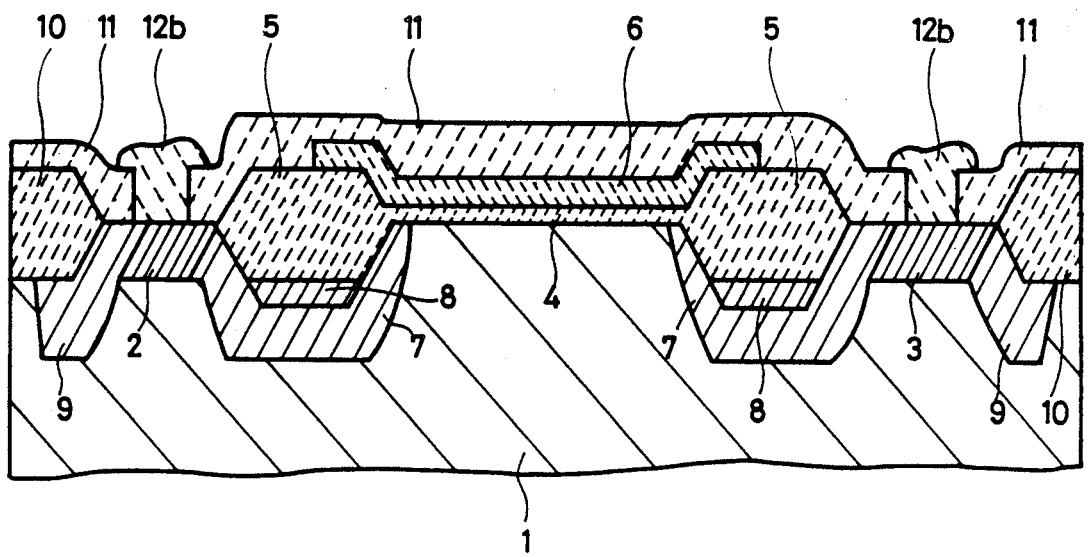
FIG. 6 is a vertical cross sectional view of another embodiment of the present invention.

As shown in FIG. 6, the thick oxide film 5, N− drain region 7 and the N drain region 8 may be provided on each of both sides of the regions 2 and 3. In this case, the region 2 may be used as a drain and the region 3 may be used as a source. This embodiment also provides the same function and the effect as in the above described embodiment.

According to the present invention, a second source.-drain region is provided which has two-layered structure of a first doped layer having a lower impurity concentration and a second doped layer having higher impurity concentration and covered the first doped layer, extending from the first source drain region of that side where the thick oxide film is deposited below the thick oxide film, so that a path of low resistance is realized and gm can be raised. In addition, a thick oxide film extending from the first gate oxide film to the source.drain region side is provided, the high break down voltage characteristics is assured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of one conductivity type having a main surface,
   first and second source/drain regions of the opposite conductivity type formed spaced apart from each other on the main surface of said semiconductor substrate, said first source/drain region comprising a surface portion and a contiguous buried portion positioned below a portion of said main surface of said substrate located between said surface portion of said first source/drain region and said second source/drain region,
   a first gate oxide film deposited between said first and second source/drain regions on the main surface of said semiconductor substrate,
   a thick second gate oxide film overlying said buried portion of said first source/drain region and extending from said first gate oxide film to said surface portion of said first source/drain region,
   said buried portion of said first source/drain region continuing and extending from the surface portion of said first source/drain region on that side where said second gate oxide film is deposited to the lower side of, and in contact with a lower surface of, the second gate oxide film and, said buried portion of said first source/drain region having a two-layered structure of (i) a lower first doped layer in contact and contiguous with said surface portion having low impurity concentration and of the opposite conductivity type and (ii) an upper second doped layer located on and surrounded by said first doped layer whereby said second doped layer is separated from said surface portion by said first doped layer, said second doped layer of the opposite conductivity type and having an impurity concentration higher than that of the first doped layer, said buried portion of said first source/drain region extending below a lower surface of said surface portion of said first source/drain region, and
   a gate electrode extending from said first gate oxide film to the second oxide film and formed between the second source/drain region and the first source/drain region.

2. A semiconductor device according to claim 1, wherein the second oxide film and the buried portion of said first source/drain region are formed only on one side of said first and second source/drain regions.

3. A semiconductor device according to claim 1, wherein said second source/drain region includes adjacent surface and buried portions, said buried portion of said second source/drain region positioned between said surface portion of said second source/drain region and said buried portion of said first source/drain region.

4. A semiconductor device according to claim 1, wherein said buried portion of said first source/drain region has said first doped layer connected to the first source/drain region and said second doped layer deposited between said first doped layer and said second oxide film.

5. A semiconductor device according to claim 1, wherein the impurity concentration is designed such that it becomes lower in the order of said surface portion of said first and second source/drain regions, said second doped layer and said first doped layer.

6. A semiconductor device according to claim 1, wherein impurity concentrations of regions said surface portion first source/drain region and said second and said first doped layers of said buried portion of said first source/drain regions are 3, 8 and 7 are substantially $10^{20}$, $10^{18}$ and $10^{17}$, respectively.

7. A MOS transistor having a high breakdown voltage for use in a semiconductor device, said MOS transistor comprising:
   a semiconductor substrate (1) of a first conductivity type having a main surface and a channel region formed thereon;
   a first gate oxide film (4) formed on said main surface of said semiconductor substrate over said channel region;
   a second gate oxide film (5) formed adjacent said channel region and having a thickness greater than a thickness of said first gate oxide film (4), said second gate oxide film being in contact with and laterally extending continuously from one side end of said first gate oxide film (4), said second gate oxide film (5) having a bottom surface lying below a bottom surface of said first gate oxide film (4);
   first and second drain/source regions (2; 3,7,8) of a second conductivity type opposite said first conductivity type formed so that said channel region of said semiconductor substrate (1) is between said first and second drain/source regions, said first drain/source region (2) lying contiguous to one side end of said channel region at the opposite end side of said first gate oxide film (4), said second drain/source region (3,7,8) having a first region (8) formed under and contiguous to the bottom surface of said second gate oxide film (5), a second region (7) under said first region (8) and formed contiguous to the other side end of said channel region at one side end, and a third region (3) formed on said main surface of said semiconductor substrate (1) extending continually from the other side end of said second region (7), impurity concentrations of said first and second regions (8,7) being lower than an impurity concentration of said third region (3) and the impurity concentration of said first region (8) being higher than the impurity concentration of said second region (7);

a gate electrode (6) formed on said first gate oxide film (4) and extending above at least a portion of said second gate oxide film (5);

a first drain/source electrode (12a) connected to said first drain/source region (2); and a second drain/source electrode (12b) connected to said third region of said second drain/source region (3).

8. A semiconductor device according to claim 1, wherein the first and second doped layers of said first source/drain region buried portion are doped with different impurities.

* * * * *